(12) United States Patent
Beyne

(10) Patent No.: US 9,966,325 B2
(45) Date of Patent: May 8, 2018

(54) SEMICONDUCTOR DIE PACKAGE AND METHOD OF PRODUCING THE PACKAGE

(71) Applicant: IMEC VZW, Leuven (BE)

(72) Inventor: Eric Beyne, Heverlee (BE)

(73) Assignee: IMEC vzw, Leuven (BE)

( * ) Notice: Subject to any disclaimer, the term of this patent is extended or adjusted under 35 U.S.C. 154(b) by 0 days. days.

(21) Appl. No.: 15/686,015

(22) Filed: Aug. 24, 2017

(65) Prior Publication Data

US 2018/0061741 A1    Mar. 1, 2018

(30) Foreign Application Priority Data

Aug. 25, 2016   (EP) ..................................... 16185640

(51) Int. Cl.
*H01L 27/105*   (2006.01)
*H01L 23/48*   (2006.01)
*H03K 3/36*   (2006.01)

(52) U.S. Cl.
CPC ........ *H01L 23/481* (2013.01); *H01L 27/1052* (2013.01); *H03K 3/36* (2013.01)

(58) Field of Classification Search
CPC .................................................. H01L 27/1052
See application file for complete search history.

(56) References Cited

U.S. PATENT DOCUMENTS

| 7,098,542 B1 | 8/2006 | Hoang et al. |
| 2008/0157316 A1 | 7/2008 | Yang |
| 2009/0244874 A1 | 10/2009 | Mahajan et al. |
| 2010/0327424 A1 * | 12/2010 | Braunisch ............... H01L 23/13 257/692 |

(Continued)

FOREIGN PATENT DOCUMENTS

| WO | WO 2010/151350 | 12/2010 |
| WO | WO 2012/012338 | 1/2012 |

OTHER PUBLICATIONS

Extended European Search Report for EP Application No. 16185640.6, dated Apr. 12, 2017.

(Continued)

*Primary Examiner* — Mounir Amer
(74) *Attorney, Agent, or Firm* — Knobbe Martens Olson & Bear LLP

(57) ABSTRACT

A package including a first die embedded in a reconstructed wafer obtainable by the known FO-WLP or eWLB technologies is disclosed. In one aspect and in addition to the first die, a Through Substrate Via insert is embedded in the wafer, the TSV insert being a separate element, possibly a silicon die with metal filled vias interconnecting contacts on the front and back sides of the insert. A second die is mounted on the back side of the substrate, with contacts on the second die in electrical connection with the TSV insert's contacts on the back side of the substrate. On the front side of the substrate, a lateral connecting device is mounted which interconnects the TSV insert's contacts on the front side of the substrate to contacts on the front side of the first die. The lateral connecting device and the TSV insert thereby effectively interconnect the contacts on the first and second dies. In another aspect, the lateral connecting device is mounted on a redistribution layer on the front side of the substrate, as it is known from FO-WLP technology.

14 Claims, 8 Drawing Sheets

(56) References Cited

U.S. PATENT DOCUMENTS

| | | | |
|---|---|---|---|
| 2011/0037157 A1 | 2/2011 | Shin et al. | |
| 2012/0049364 A1* | 3/2012 | Sutardja | H01L 24/24 257/738 |
| 2013/0221493 A1* | 8/2013 | Kim | H01L 23/481 257/620 |
| 2014/0070380 A1 | 3/2014 | Chiu et al. | |
| 2014/0103527 A1 | 4/2014 | Marimuthu et al. | |
| 2014/0174807 A1* | 6/2014 | Roy | H01L 25/0655 174/261 |
| 2014/0264791 A1 | 9/2014 | Manusharow et al. | |
| 2014/0264836 A1 | 9/2014 | Chun et al. | |
| 2015/0228583 A1* | 8/2015 | Karhade | H01L 23/538 257/774 |
| 2017/0062384 A1 | 3/2017 | Lee et al. | |

OTHER PUBLICATIONS

Jin, et al., Next Generation eWLB (embedded Wafter Level BGA) Packaging, Proceedings of Electronics Packaging Technology Conference (EPTC), 2010.

* cited by examiner

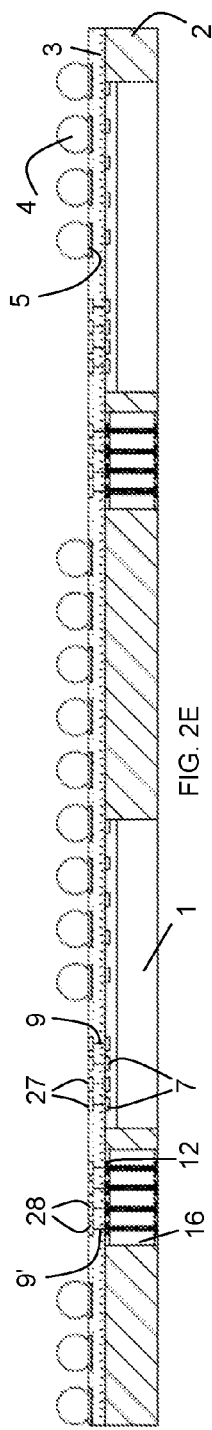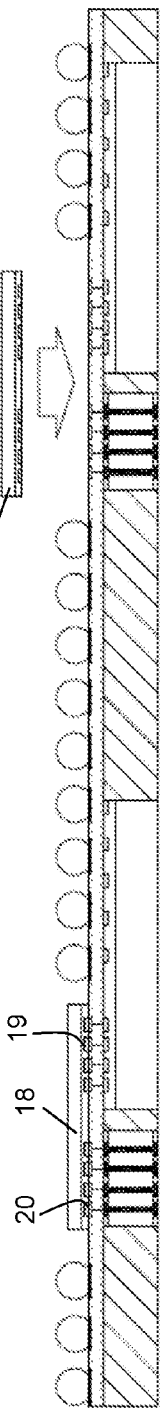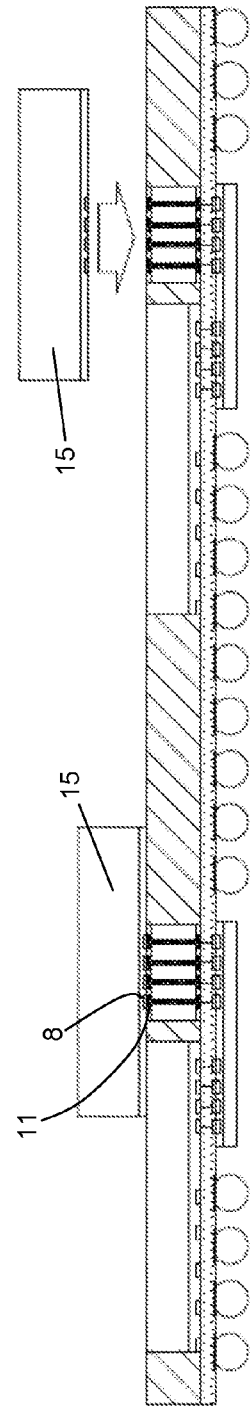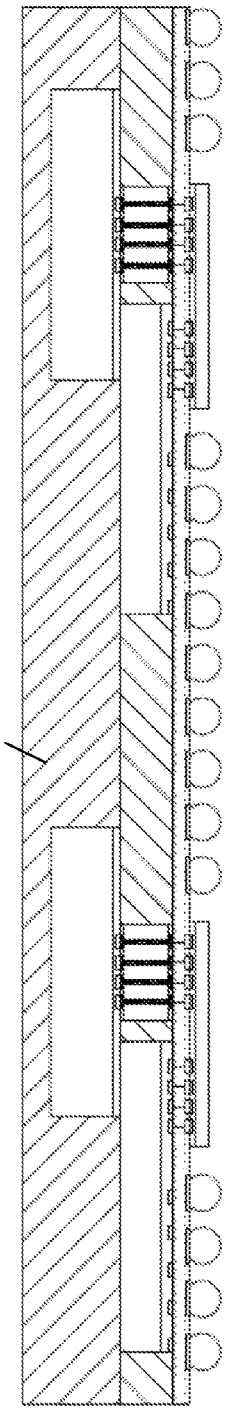

SEMICONDUCTOR DIE PACKAGE AND METHOD OF PRODUCING THE PACKAGE

CROSS-REFERENCE TO RELATED APPLICATIONS

This application claims foreign priority to European Patent Application No. 16185640.6, filed Aug. 25, 2016, the contents of which are incorporated by reference herein in its entirety.

BACKGROUND

Technological Field

The present disclosure is related to semiconductor processing, in particular to integration of multiple integrated circuit dies in a 3D-interconnected package.

Description of the Related Technology 3D-integration of integrated circuit devices, also referred to as semiconductor chips or dies, has known many developments in recent years. In particular, the integration of two or more dies with a large number of die-to-die interconnects has become a challenge in terms of the size of the package and the heat dissipation problem. The traditional PoP (Package-on-Package) approach involves the packaging of two dies, for example an application processor in a mobile application and a memory chip, in separate ball-grid array type packages, and assembling one package on top of the other. The resulting package height may be problematic, and package-level solder balls do not allow to realize a large number of interconnections at small pitch, as it is required for example for realizing integration according to the Wide I/O standard.

One improvement that has been proposed is using an embedded die package or wafer-level reconstructed die package for the bottom die. The embedded die package embeds the silicon die in a laminated PCB. The reconstructed package uses wafer-level molding technology to reconstruct a wafer or panel-shaped substrate, which allows for the creation of thin film package-level interconnects in a redistribution layer (RDL). This technology is known as Fan-Out Wafer Level Packaging (FO-WLP) or eWLB, embedded Wafer Level Ball Grid Array, as illustrated for example in "Next generation eWLB packaging," by Yonggang Jin et al., Proceedings of Electronics Packaging Technology Conference (EPTC), 2010.

In order to enable a package-on-package solution, the FO-WLP approach requires vertical through-package interconnects, connecting the front of the package to the backside. This may be done by laser drilling and filling the holes with Cu or solder to produce through-package vias (TPVs). Another technique uses plating of Cu pillars before die embedding. The obtainable TPV pitch is, however, rather limited (e.g., TPV-to-TPV pitch not smaller than several 100 μm).

In order to enable the high bandwidth technology, such as required for Wide I/O DRAM memory, that consists of 4 banks of 6×73 contact pads at a 40 μm pitch, a much higher through-package interconnect density is required.

This can be enabled by direct stacking of the Wide I/O DRAM on the logic die, using through-Si vias in the logic die. This does, however, require TSVs (Through Silicon Vias, or more generally Through Substrate Vias) in the logic die. Also, the thermal coupling between the logic die and the DRAM die is rather high. A different solution is the use of a silicon interposer to realize the high density interconnects using a high density Silicon technology. This allows for lateral placement of the dies (i.e., side-by-side on the interposer). However, the package construction becomes rather expensive. An alternative solution is to remove the package substrate and realize the package as a wafer-level Chip-scale package (CSP). These solutions, however, do not allow for an independent packaging and easy testing of the logic die.

SUMMARY OF CERTAIN INVENTIVE ASPECTS

The present disclosure is related to a semiconductor die package and a method for producing the package, as disclosed herein. A package according to the present disclosure includes a first die embedded in a reconstructed wafer obtainable by the known FO-WLP or eWLB technologies referred to above. In addition to the first die, placed adjacent to the first die, a Through Substrate Via insert is embedded in the wafer, the TSV insert being a separate element, possibly a silicon die with metal filled vias interconnecting contacts on the front and back sides of the insert. A second die is mounted on the back side of the substrate, with contacts on the second die in electrical connection with the TSV insert's contacts on the back side of the substrate. On the front side of the first die and the TSV insert, a lateral connecting device is mounted which interconnects the TSV insert's contacts on the front side of the substrate to contacts on the front side of the first die. The lateral connecting device and the TSV insert thereby effectively interconnect the contacts on the first and second dies. According to an embodiment, the lateral connecting device is mounted on a redistribution layer (RDL) on the front side of the substrate, as it is known from FO-WLP technology. Package-level solder balls are provided on the RDL, as in known packages, and may be interrupted at the location of the lateral connecting device. According to another embodiment, the lateral connecting device is equally embedded in the reconstructed wafer.

One of the advantages of the package according to the present disclosure is that testing of the first die can be performed before mounting the second die. In addition, the second die can in many cases be placed to overlap the first die, depending on the location of contacts on the second die. When overlap is possible, this reduces the overall package size as well as the interconnect length when compared to the classic interposer solutions. The TSV inserts and lateral connecting devices can be produced by applying known interposer technology as will be explained in the detailed description. This allows the expensive interposer technology to be limited to smaller dies, leading to a cost reduction in comparison with existing techniques.

The present disclosure is in particular related to a semiconductor die package comprising:
  a substrate formed of a mold material, wherein embedded side by side in the mold material are a first semiconductor die and a Through Substrate Via (TSV) insert, the substrate, the TSV insert, and the first die having a front side and a back side, and wherein
  the TSV insert includes N contacts on the front side of the insert, N contacts on the backside of the insert and N metal-filled vias individually interconnecting the contacts on the front and back sides of the insert, N being an integer higher than or equal to 1,
  the first die includes N contacts on the front side of the first die, the first die further includes one or more contact terminals on the front side of the first die, a second semiconductor die mounted on the back side of the substrate, the second semiconductor die including N contacts which are individually connected to the N contacts of the TSV insert on the back side of the insert, a lateral connecting device mounted on the front side of the first die and the TSV insert, the lateral connecting device being provided with a first and second group of N contacts each, the groups being placed side by side on the same surface of the lateral connecting device, wherein the first and second group of N contacts are individually interconnected inside the lateral connecting device, and wherein the first and second groups of N contacts on the lateral connecting device are individually connected respectively to the N contacts on the first die and to the N contacts of the TSV insert on the front side of the insert, so that the N contacts on the first die are individually connected to the N contacts on the second die, through the lateral connecting device and the TSV insert, a plurality of package level contact bumps connected to at least some of the contact terminals on the first die.

According to an embodiment, the lateral connecting device is external to the substrate and mounted on the front side of the substrate. In the latter case, the package may further comprise a redistribution layer (RDL) on the front side of the substrate, wherein the package level contact bumps are mounted on the outer surface of the RDL and connected to the contact terminals of the first die through conductors within the RDL, and wherein the lateral connecting device is equally mounted on the outer surface of the RDL.

The RDL may include conductors connecting the N contacts on the first die to a first group of N corresponding contacts on the outer surface of the RDL, the RDL further including conductors connecting the N contacts on the front side of the TSV insert to a second group of N corresponding contacts on the outer surface of the RDL, and wherein the first and second group of N contacts on the lateral connecting device are bonded individually respectively to the first and second groups of contacts on the RDL.

According to an embodiment of the present disclosure, the lateral connecting device is bonded directly to the front side of the first semiconductor die and the TSV insert. In the latter case, the lateral connecting device may equally be embedded in the mold material of the substrate. Still in the latter case, with or without the lateral connecting device embedded in the mold material, the contact terminals of the first die may be contact pillars, the height of which is sufficient for contacting the first die from the front side despite the presence of the lateral connecting device.

In the latter embodiment, the package may include a redistribution layer (RDL) on the front side of the substrate, wherein the package level contact bumps are mounted on the outer surface of the RDL and connected to the contact pillars of the first die through conductors within the RDL. The RDL may be in direct physical contact with the back side of the lateral connecting device or there may be a layer of mold material between the RDL and the back side of the lateral connecting device.

A package according to the present disclosure that includes an RDL may further include one or more additional semiconductor dies mounted on the back side of the substrate, each additional die being connected to the front side of the substrate by an additional TSV insert and wherein the additional TSV insert is connected to the first semiconductor die by conductors within the RDL.

According to an embodiment, the lateral connecting device comprises a semiconductor substrate and a back end of line portion, and the interconnection between the first and second group of contacts of the lateral connecting device is established through circuitry in the back end of line portion.

According to an embodiment, the first semiconductor die is a logic die and the second semiconductor die is a memory die, wherein the N contacts on the first and second dies are formed as dense arrays of I/O contacts.

According to an embodiment, the N contacts on the second semiconductor die are bonded directly to the N contacts on the back side of the TSV insert.

BRIEF DESCRIPTION OF THE DRAWINGS

The figures are schematic images illustrating embodiments of the present disclosure, and are not drawn to scale.

FIGS. 2A through 2H illustrate preferred method steps for producing the package of FIG. 1.

DETAILED DESCRIPTION OF CERTAIN ILLUSTRATIVE EMBODIMENTS

Figure 1:
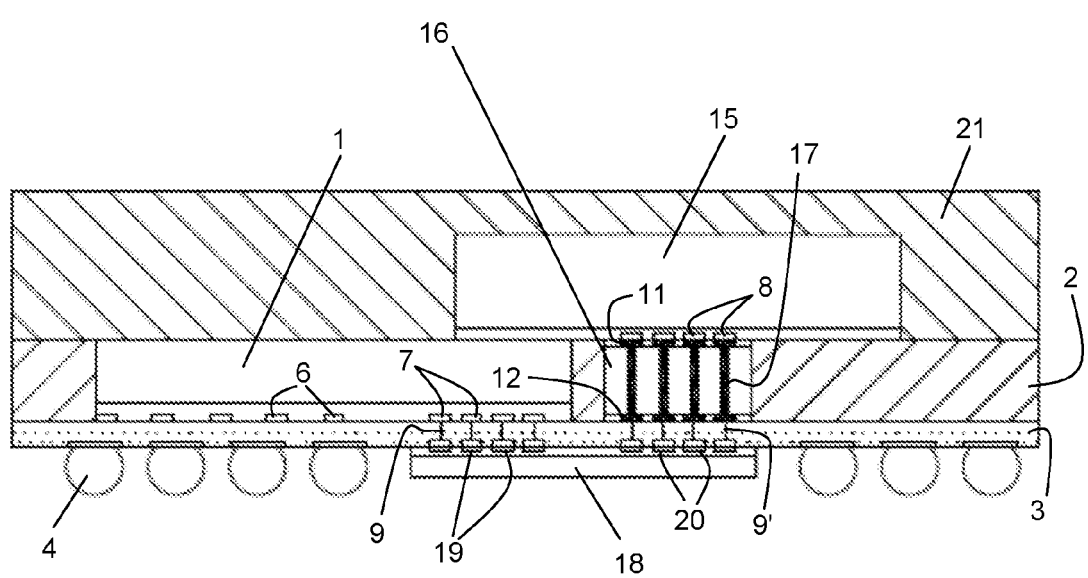
FIG. 1 shows a semiconductor die package according to one embodiment of the present disclosure.

The package shown in FIG. 1 comprises a logic die 1 and a memory die 15 with interconnected arrays of I/O contacts 7/8. For example the memory die 15 may be a DRAM chip configured according to the Wide I/O standard. Both arrays of contacts 7 and 8 are in that case configured according to this standard, i.e., each array comprises 4 banks of 6×73 contact pads at a 40 μm pitch. The present disclosure, however, is not limited to such devices and the embodiment of FIG. 1 is to be understood as merely illustrating a typical field of application of the present disclosure. The logic die 1 is embedded in a substrate 2 formed of a mold material and comprising a redistribution layer (RDL) 3 on the front side of the substrate. Package level solder balls 4 are mounted on contact pads 5 provided on the surface of the RDL 3, for establishing a connection, through the circuitry (not shown) contained in the RDL 3, to contact terminals 6 provided on the front side of the logic die 1. The front side of the logic die 1 is furthermore provided with an array of I/O contacts 7 which are connected individually to a corresponding array of I/O contacts 8 on the memory die 15, mounted on the backside of the substrate 2, "individually" meaning that each contact of one array is connected to a corresponding contact of the other array (this definition of "individually" applies throughout this description). In addition to the logic die 1, and adjacent to the die, a Through Substrate Via (TSV) insert 16 is embedded in the mold material of the substrate 2. The TSV insert 16 may be a silicon die comprising a plurality of metal-filled vias 17 which connect an array of contacts 11 on the back side of the insert 16 to a corresponding array of contacts 12 on the front side of the insert 16. As the insert 16 is embedded in the substrate material, the front and back sides of the insert 16 coincide with the front and back side of the substrate 2. The number of vias 17 corresponds to the number of I/O contacts 7 on the logic die 1 as well as to the number of I/O contacts 8 on the memory die 15.

The I/O contacts 8 on the memory die 15 are directly bonded to the contacts 11 on the back side of the TSV insert 16. On the front side of the RDL 3, a lateral connecting device 18 is mounted. The lateral connecting device 18 comprises two arrays of contacts 19/20 on the same surface of the lateral connecting device 18, each array having the same number of contacts as the arrays 7 and 8 on the logic die 1 and the memory die 15. The contacts 19 of the first array are individually connected to corresponding contacts 20 of the second array by circuitry provided in the lateral connecting device 18. The contacts 19 of the first array are furthermore connected individually to the I/O contacts 7 on the logic die 1 by circuitry provided in the RDL 3, preferably by vertical conductors 9. Likewise, the contacts 20 of the second array are individually connected to the contacts 12 on the front side of the TSV insert 16 by circuitry provided in the RDL 3, preferably by vertical connections 9'. These vertical connections 9/9' are drawn schematically as lines but they can be brought into practice according to known techniques. In one embodiment, the vertical connections 9/9' consist of a series of via and pad connections designed in the RDL interconnect stack. Typical implementations are stacked via-connections (all vias and pads aligned with the interconnect pad footprint) or stair-case via connections (vias do not align on top of each other but are slightly offset with respect to each other). The lateral connecting device 18 and the TSV insert 16 thereby establish an individual connection between the I/O contacts 7 and 8 of the logic die 1 and the memory die 15. The memory die 15 is protected by a second layer of mold material 21.

The lateral connecting device 18 may be a silicon die including a number of back end of line layers, for example a power/ground reference layer and a single high-density interconnect layer, for realizing the connection between the first and second array of contacts 19 and 20 on the lateral connecting device.

Figure 2A:
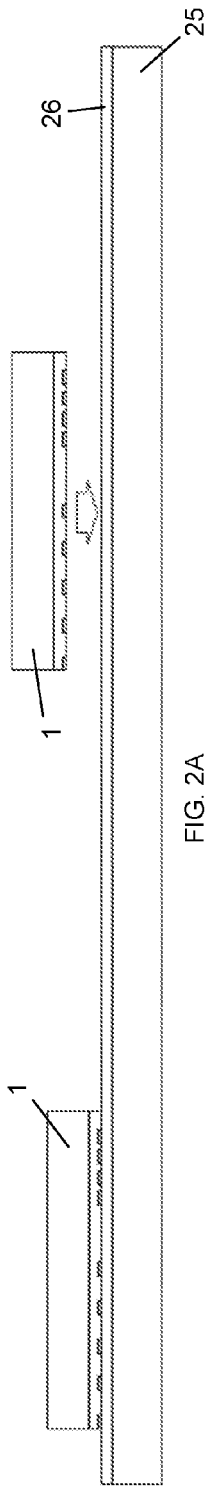
Figure 2B:
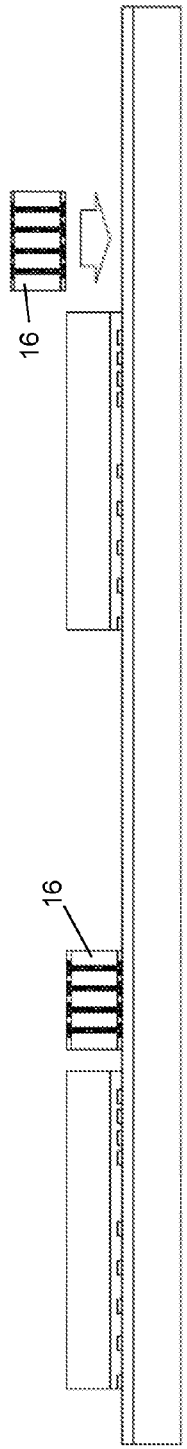
Figure 2C:
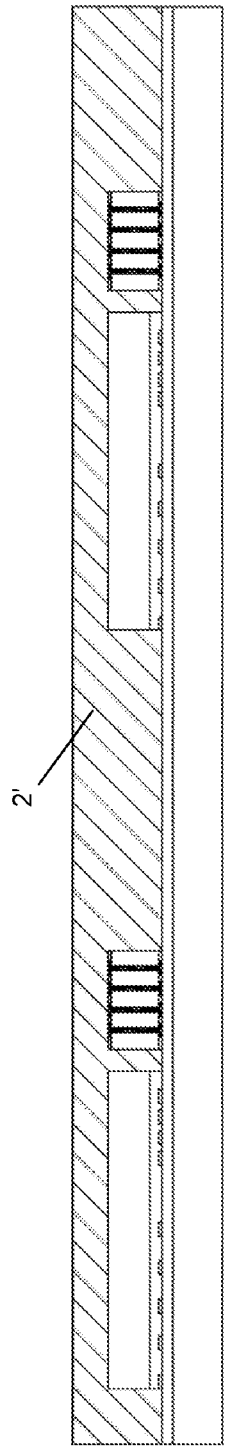
Figure 2D:
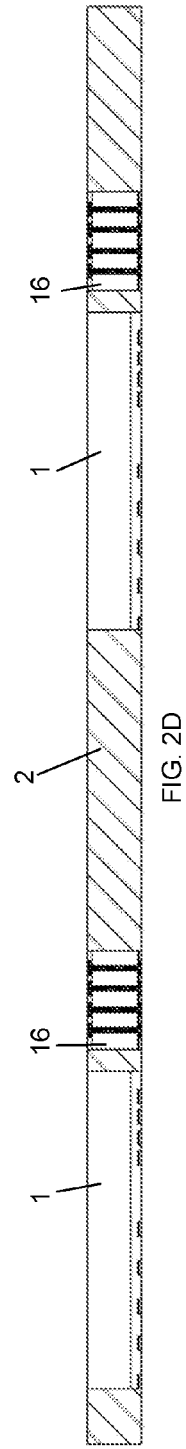

FIGS. 2A through 2H illustrate method steps for producing the package of FIG. 1 according to one embodiment. The process is performed at wafer level, i.e., on a wafer comprising a plurality of logic dies 1. The logic dies 1 are first attached to a temporary carrier wafer 25 through an adhesive layer 26 (FIG. 2A). Following this, the TSV inserts 16 are placed adjacent to the logic dies 1 (FIG. 2B). The height of the logic dies 1 is substantially the same as the height of the TSV inserts 16. The logic dies 1 and the inserts 16 are then embedded in a mold material 2', preferably by a compression molding technique as known per se in the above described domain of fan-out wafer level package technology (FIG. 2C). Also the type of carrier substrate 25 and adhesive layer 26 may be according to known technology applied in FO-WLP. The mold material is also preferably a material commonly applied in FO-WLP. Such mold materials typically consist of a thermoset polymer material mixed with a large volume fraction of inorganic materials (typically small silica particles) to control the mold material's mechanical properties (coefficient of thermal expansion and elastic moduli). After setting of the mold material, this material is removed above the level of the logic dies 1 and the inserts 16 by a suitable thinning technique, preferably by grinding, after which the carrier 25 and the adhesive layer 26 are removed by peeling off, yielding the reconstructed substrate 2 consisting of mold material with logic dies 1 and TSV inserts 16 embedded therein, as shown in FIG. 2D.

After flipping the substrate, a redistribution layer 3 is applied (FIG. 2E), equally in accordance with known techniques applied in FO-WLP, preferably applying thin film technology for producing one or more back end of line-type interconnection levels which connect contact terminals 6 on the logic die 1 to contact pads 5 on the upper surface of the RDL 3, onto which the package level solder balls 4 are produced, e.g., this may be ball grid array (BGA) or chip scale package (CSP) type contact structures. The RDL 3 typically includes line geometries that are relatively large in terms of thickness, width and spacing. Typical line-width and spacing is in the order of 5 µm, going down to about 2 µm by applying state-of-the-art techniques. The RDL 3 furthermore includes individual connections 9 between the array 7 of I/O contacts on the logic dies 1 and a first array of contacts 27 on the surface of the RDL 3, as well as individual connections 9' between the array of contacts 12 on the front side of the TSV inserts 16 and a second array of contacts 28 on the surface of the RDL 3. No package level solder balls are applied on the areas comprising the contacts 27/28. At this point, contacts are available to fully test the embedded die 1 and in case of a faulty die, a decision can be made not to assemble additional dies on this particular location of the reconstructed wafer.

As shown in FIG. 2F, the lateral connecting devices 18 are then mounted onto the RDL 3, preferably by flip-chip technology as known in the art, so that the first and second array of contacts 19/20 on each lateral connecting device 18 are respectively bonded to the first and second array of contacts 27/28 on the surface of the RDL 3. At this point the high density TSV insert 16 and the connections via the lateral connecting device 18 to the embedded die 1 can be tested. In case these connections are defective, a decision can be made not to assemble additional devices at this location.

As shown in FIG. 2G, the memory dies 15 are then mounted on the backside of the package, preferably by flip-chip technology, so that the I/O contacts 8 of the memory dies are bonded to the contacts 11 on the backside of the TSV inserts 16. The memory dies 15 may be protected by a second overmold process, wherein a further mold material 21 is applied over the memory dies, as shown in FIG. 2H. The substrate 2 may then be singulated to form separate packages of the type shown in FIG. 1.

Alternatives to the above-described process steps are within the knowledge of the skilled person and may depend on the type of semiconductor dies 1 and 15 that are to be interconnected through the TSV insert 16 and the lateral connecting device 18. For example, the redistribution layer 3 is not always required. When no RDL is present, the lateral connecting device 18 may be bonded directly to the arrays of contacts 7 and 12 on the front side of the logic die 1 and the TSV insert 16 respectively.

In the example implementations illustrated in the drawings, and unless stated otherwise, the contacts have been presented as contact pads lying in an outer layer of the devices that are to be bonded by flip-chip technology. This is a simplified representation of what may be more complex in reality, as would be clear to the skilled person. The term "contact" can be a contact pad or a contact bump, depending on how the contacts are to be interconnected to subsequent devices or layers. For example, one device may be provided with pads or hollow contact areas, whereas the other side is provided with bumps, or both sides may be provided with bumps. The bumps or pads may be built from a plurality of layers. Contacts may be on top of the upper layer instead of embedded therein as illustrated in the example implementations of the drawings. Additionally, example devices have been drawn the same before bonding and after bonding in the figures. This may not be the case in reality, as flip-chip in many cases involves an underfill step, wherein bonded contacts are embedded in an underfill material after the actual bond has been established. Also, contact pads or bumps will usually undergo a reflow and merge into a single contact structure. The drawings have made abstraction of these details in order to simplify the description of the present disclosure and to aid in understanding the present disclosure. It is to be noted however, that the bonding of contacts as presented in the drawings and described in this specification may take place according to any method that is applicable in the art known today.

Also, wherever it is stated in the present description or in the claims that in an assembled device, "contacts" of a first device are "bonded directly" to "contacts" of a second device, this means that this assembly was obtained by placing contacts of the first device in direct physical contact with contacts of the second device, to form an electrical connection between the contacts. In the assembly obtained after bonding, the original contacts of the two bonded devices may no longer be distinguishable as there has been a merger of materials forming the established bond. When this is the case, the "contacts" of the assembled device are thus to be understood as parts of a merged contact structure, one part being attached to the first device, the second part being attached to the second device. The feature "bonded directly" is then to be understood as the feature according to which these parts are connected by a contact structure that is uniform with the "contacts."

The TSV insert 16 and the lateral connecting device 18 may be produced by techniques known for example from Si-interposer technology. The following is an example process flow for producing the TSV insert 16.
1. Providing a Si wafer.
2. Deposition of an insulating layer on the wafer, e.g., $SiO_2$ by chemical vapor deposition (CVD).
3. Formation of the array of TSVs 17:
    a. Deposition of photoresist and photopatterning of a TSV pattern.
    b. Etching of the insulating layer and the Si to form deep blind holes in the front side of the Si substrate; e.g., 10 µm diameter and 100 µm deep or 5 µm diameter and 50 µm deep.
    c. Deposition of a dielectric layer, conformally covering the sidewalls and bottom of the exposed Si holes and the upper surface of the wafer, with the aim of forming an insulating liner between the TSV and the Si substrate. Typical materials used as liners are Ozone-Teos CVD oxides and plasma-enhanced ALD conformal oxides.
    d. After forming the blind holes and the liner, a Cu barrier layer (e.g., Ti or Ta) is deposited on the walls and bottom of the blind holes and on the upper surface of the wafer, followed by a Cu deposition process by Physical Vapor Deposition (PVD) to form a Cu seed layer on the walls and bottom and upper surface.
    e. Subsequently the holes are filled using Cu electroplating, with Cu also forming on the upper surface of the wafer.
    f. After Cu anneal, the plated Cu, the seed Cu and barrier and liner layers are removed from the upper surface of the wafer by CMP processing, resulting in electrically isolated Cu inserts in the top layer of the Si wafer.
4. After TSV processing, front side Cu pillars are fabricated on the wafer front side. These Cu pillars will form the contacts 12 on the front side of the TSV insert. These pillars can be realized, for example, using a semi-additive Cu plating process as follows:
    a. A Cu plating seed layer is deposited by Physical Vapor Deposition (PVD) (for example, Ti/Cu or TiW/Cu),
    b. A photoresist is deposited and patterned, leaving holes in the locations intended for Cu pillars, the holes covering the isolated Cu inserts in the top layer of the wafer,
    c. Electrolytic deposition of Cu in the open areas of the patterned photoresist,
    d. Stripping of the photoresist,
    e. Back-etching of the PVD Cu seed and the (Ti or TiW) adhesion layer, minimizing the loss of Cu of the much thicker Cu pillars.
5. After forming the Cu pillars, the pillars are embedded in a polymer layer. This can be done, for example, by spin-coating or dry film lamination.
6. After depositing the polymer layer, the surface of the wafer is planarized, exposing only the tops of the Cu pillars. This can be done through wafer-level grinding, surface planarization or CMP (chemical mechanical polishing) technology.
7. The wafer is bonded to a carrier Si wafer using a temporary bonding adhesive layer.
8. The backside of the wafer is thinned using mechanical grinding; the wafer is cleaned after grinding,
9. The TSVs embedded in the wafer are exposed from the backside. In one example, a "soft" via-reveal process is used as follows:
    a. Further thinning of the Si using wet or dry etch techniques. Using an end-point detection system, the thinning is stopped when the tips of the embedded Cu TSV structures are exposed from the wafer backside. The Cu TSVs are still covered with the TSV liner oxide layer.
    b. A backside passivation and insulating layer is deposited (for example, a stack of SiN and SiO2 layers). A photoresist layer is applied, planarizing the exposed TSV tips.
    c. A dry back-etching step is used to reveal the TSV tips, and using an oxygen-etching chemistry, the tips of the backside passivation and TSV liner are removed, exposing the metal of the TSV (actually the TSV barrier layer, for example Ti or Ta).
    Alternatively a CMP opening process can be used, where a thicker backside oxide layer is first deposited, embedding the exposed backside TSV tips. Next, a CMP step is used to open the Cu of the exposed TSVs.
10. Finally, the process used for producing the front-side Cu pillars 12 is repeated on the backside of the thinned wafer to form the back side pillars 11, resulting in the symmetric TSV insert structure shown in FIGS. 1 through 5J.
11. The remaining processes include thin wafer debonding from the carrier substrate and transfer to a dicing tape, followed by dicing the wafer to the final individual TSV inserts 16.

According to an embodiment, the Cu pillars are not embedded in a polymer, or the pillars are embedded in a polymer on only one of the two sides of the insert 16. When the pillars are not embedded they may be bonded, for example, to hollow bonding pads on contacts of a semiconductor die or on the lateral connecting device 18.

The lateral connecting device 18 may be produced from a silicon wafer, by producing on the wafer a number of back-end-of-line type layers, such as a power/ground reference layer and a single high-density interconnect layer, and producing the two arrays of contacts 19 and 20 thereon. Afterwards, the wafer may be attached to a temporary carrier and thinned. The wafer may then be diced to form separate lateral connecting devices 18. The technology applied for producing the back-end-of-line type layers and the contact arrays on the lateral connecting device 18 may be the known technology for producing similar layers and contacts on an interposer substrate, for example using cost-effective 65 nm node processing facilities.

Figure 3:
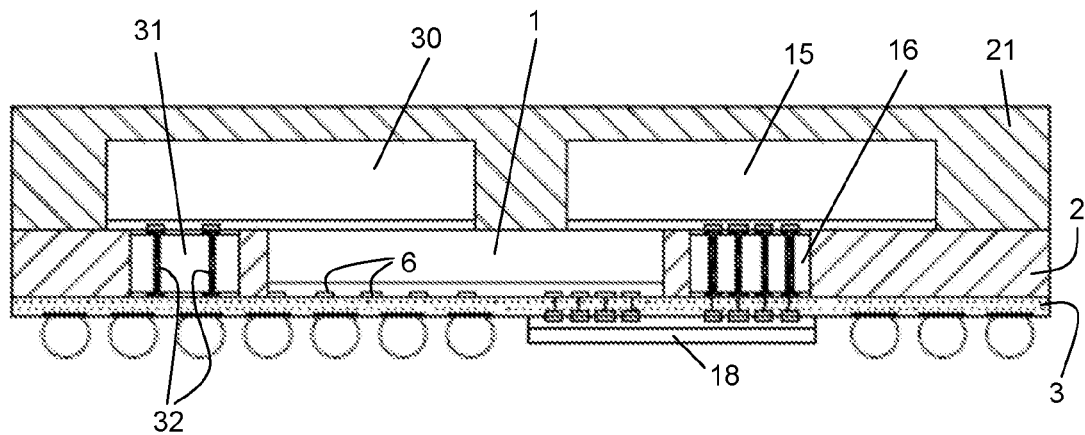
FIG. 3 illustrates an embodiment of a package according to the present disclosure including an additional die.

The lateral connecting device 18 allows to establish connections between very dense arrays of contacts, as encountered in Wide I/O type technology. For such high density interconnects, the regular fan-out interconnect technology for packages, as used for producing the redistribution layer 3, is not adequate or requires a large number of layers to realize the interconnection between the logic die 1 and the TSV insert 16. The application of the lateral connecting device 18 provides a solution to that problem. When the number of interconnects is less dense, connections may be realized within the redistribution layer 3 itself. FIG. 3 illustrates an embodiment wherein an additional die is included in the package. In the exemplary case wherein the first die 1 is a logic die and the second die 15 is a Wide I/O DRAM, the third die 30 could be a flash memory die, equally overlapping the logic die 1 and connected thereto via an additional TSV insert 31. This second insert 31 includes less metal-filled vias 32, in agreement with the reduced number of connections between the flash memory die 30 and the logic die 1. This reduced number of connections does not require a separate lateral connecting device; connection between the contacts on the front side of the second insert 31 and contact terminals 6 on the logic die 1 can be incorporated in the circuitry of the redistribution layer 3.

Figure 4:
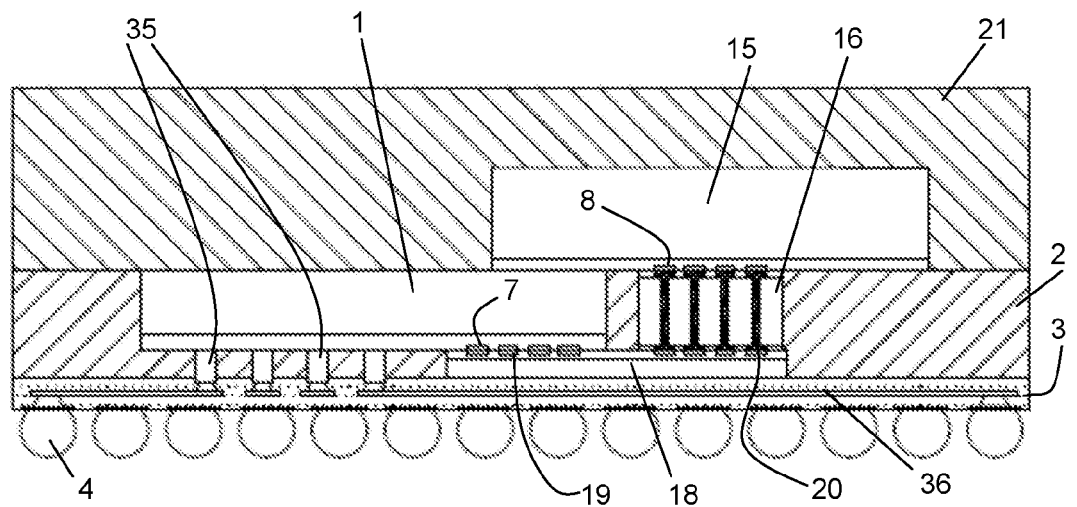
FIG. 4 illustrates a semiconductor package according to another embodiment.

According to another embodiment, the lateral connecting device 18 is equally embedded in the mold material of the FO-WLP substrate. A package according to this embodiment is shown in FIG. 4. In this embodiment, the logic die 1 is provided with high contact pillars 35 obtainable in a similar manner as described above in relation to the TSV insert 1, however without the step of embedding the pillars in a polymer layer. The TSV insert 16 itself and the lateral connecting device 18 are the same as in the previous embodiment. The lateral connecting device 18 is now mounted so that its arrays of contacts 19/20 are directly bonded to the arrays of contacts 7 on the logic die 1 and on the front side of the TSV insert 16. The high contact pillars 35 are needed because of the location of the lateral connecting device 18, and the pillars must be high enough to allow these pillars 35 and thereby the logic die 1 to be contacted from the front side, despite the presence of the lateral connecting device on the front side. In the embodiment shown, the pillars 35 are connected to a redistribution layer 3 and to package level solder balls 4 on the RDL 3, through redistribution circuitry 36 in the RDL 3. This embodiment has the advantage that the solder balls 4 need not be interrupted for the placement of the lateral connecting device 18. The redistribution circuitry 36 is also present in the RDL 3 shown in FIGS. 1 through 3, but it is not shown explicitly in these drawings in order not to overload the figures with details.

Figure 5A:
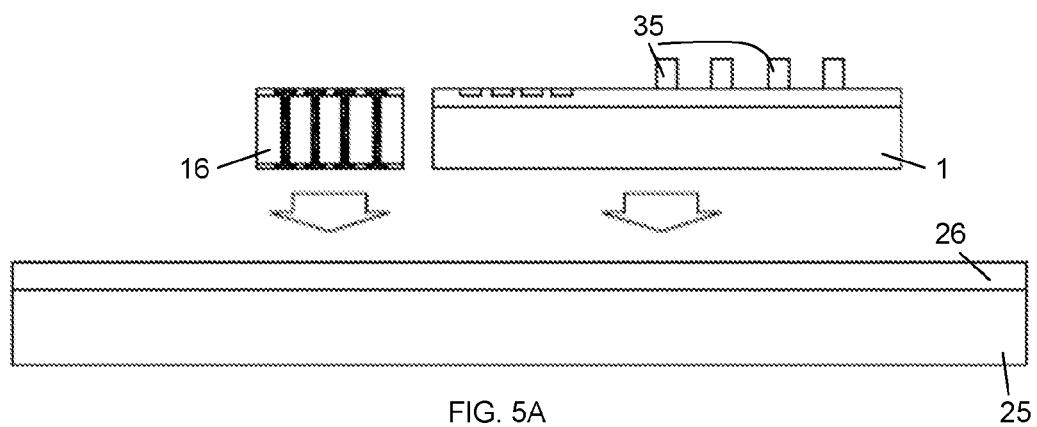
FIGS. 5A through 5J show method steps applicable for producing the package shown in FIG. 4.
Figure 5B:
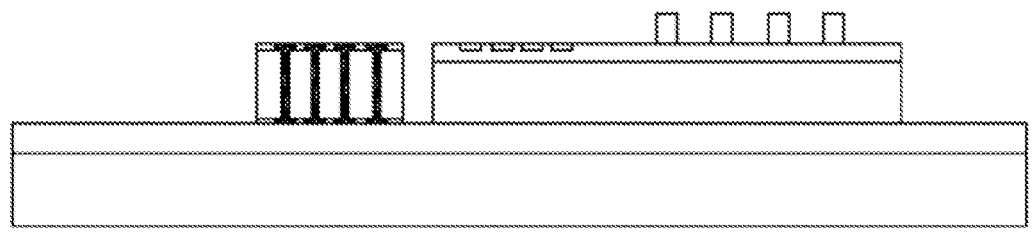
Figure 5C:
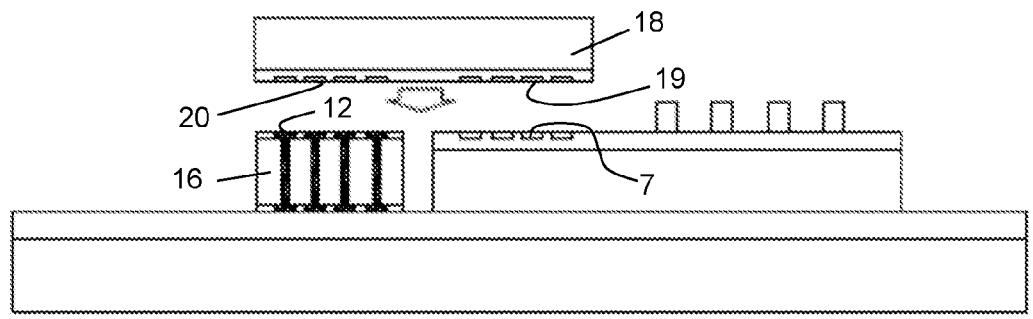
Figure 5D:
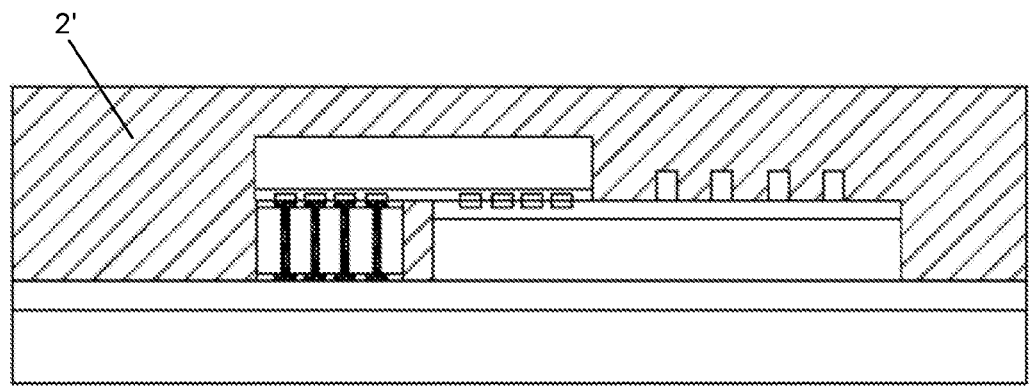
Figure 5E:
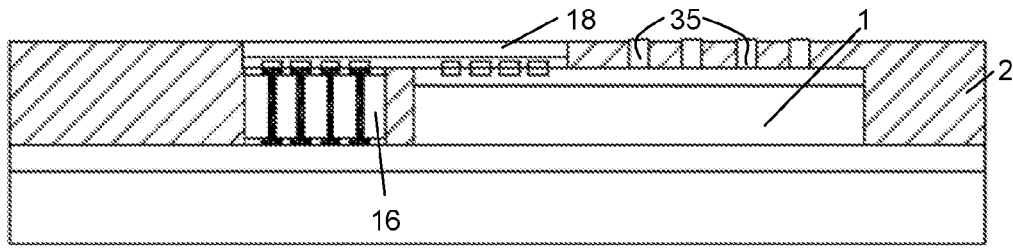
Figure 5F:
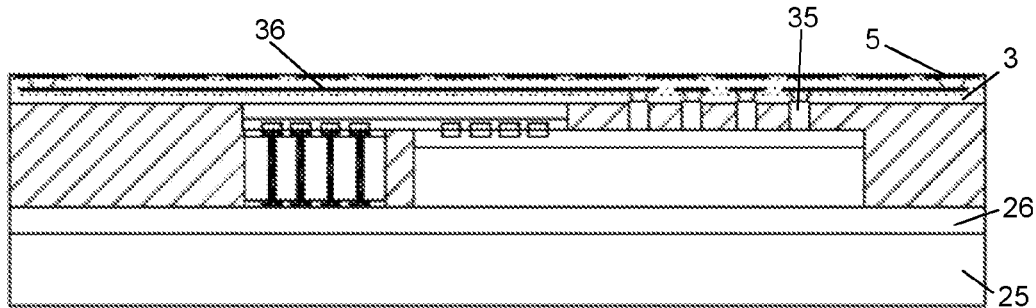
Figure 5G:
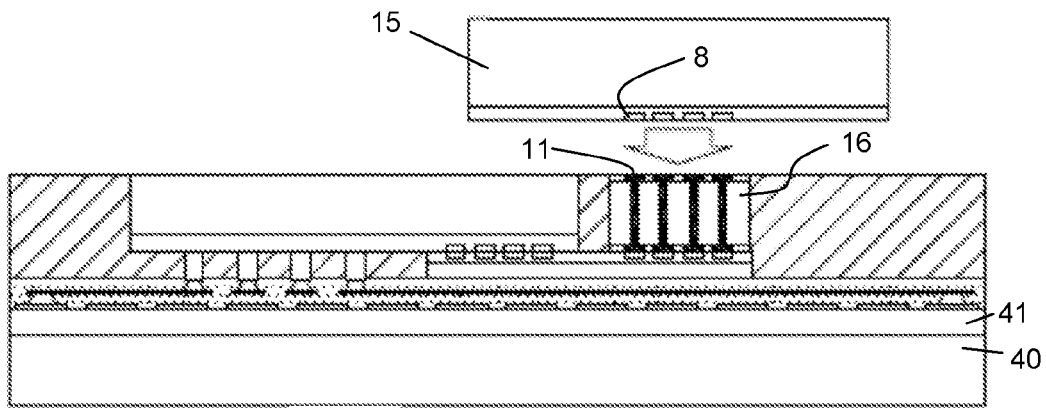
Figure 5H:
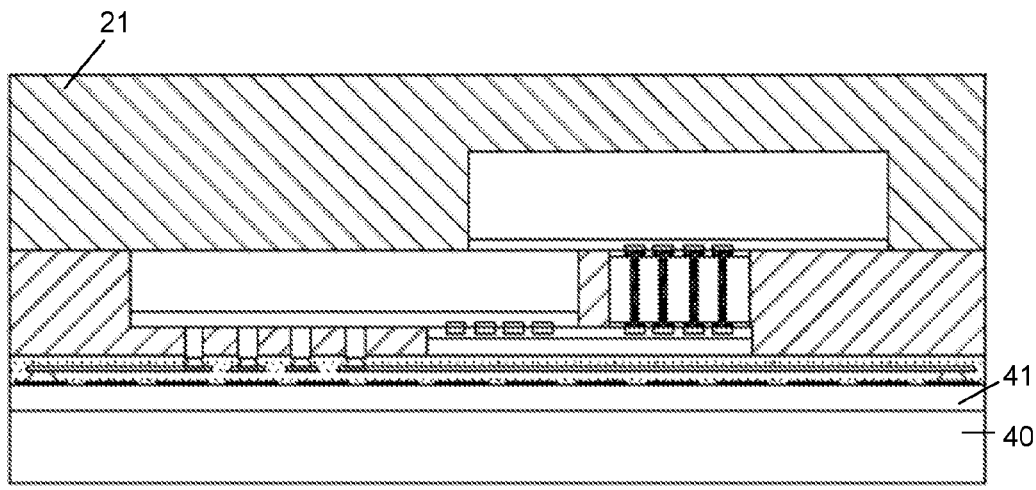
Figure 5I:
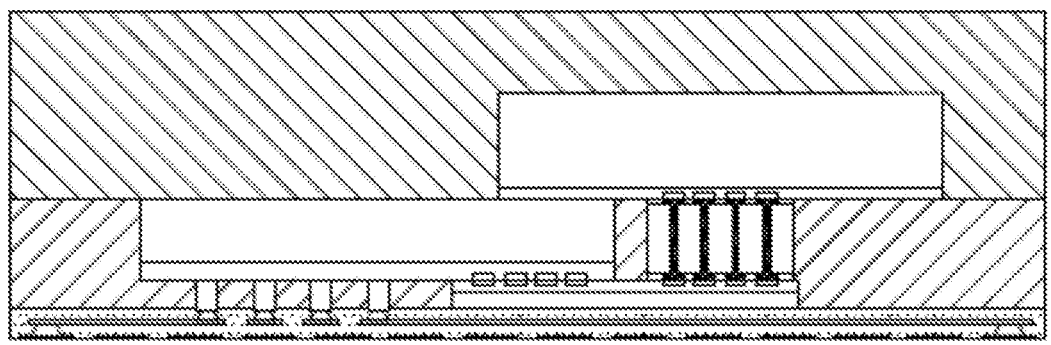

FIGS. 5A through 5J illustrate possible process steps for producing the package according to FIG. 4. The steps are shown for the production of one single package, but they are preferably performed on wafer level, i.e., for the production of several packages on a single wafer, in analogy with the steps shown in FIGS. 2A through 2H. As seen in FIGS. 5A and 5B, the logic die 1 and the TSV insert 16 are attached to a temporary carrier 25 via an adhesive layer 26. Then the lateral connecting device 18 is bonded directly to the logic die 1 and the insert 16 by flip chip bonding (see FIG. 5C), i.e., the array of contacts 7 on the logic die 1 are directly bonded to the first array of contacts 19 on the lateral connecting device 18 and the array of contacts 12 on the front side of the TSV insert 16 are directly bonded to the second array of contacts 20 on the lateral connecting device 18. The height of the lateral connecting device 18 is higher than in the previously described embodiment. Then, this assembly of the three devices 1, 16 and 18 is embedded in mold material 2', preferably by compression molding (see FIG. 5D), followed by planarization through back-grinding (see FIG. 5E), until the metal contact pillars 35 of the logic die 1 become exposed. The lateral connecting device 18 itself is equally thinned by the back-grinding step. This results in the production of reconstructed wafer 2 of mold material, with the assembly of the logic die 1, the TSV insert 16 and the (thinned) lateral connecting device 18 embedded therein. An alternative to the steps shown in FIGS. 5D and 5E is to embed the assembly by transfer molding using a film of mold material, in which case the lateral connecting device 18 needs to be at the correct thickness at the time when it is bonded to the TSV insert 16 and the logic die 1.

Figure 5J:
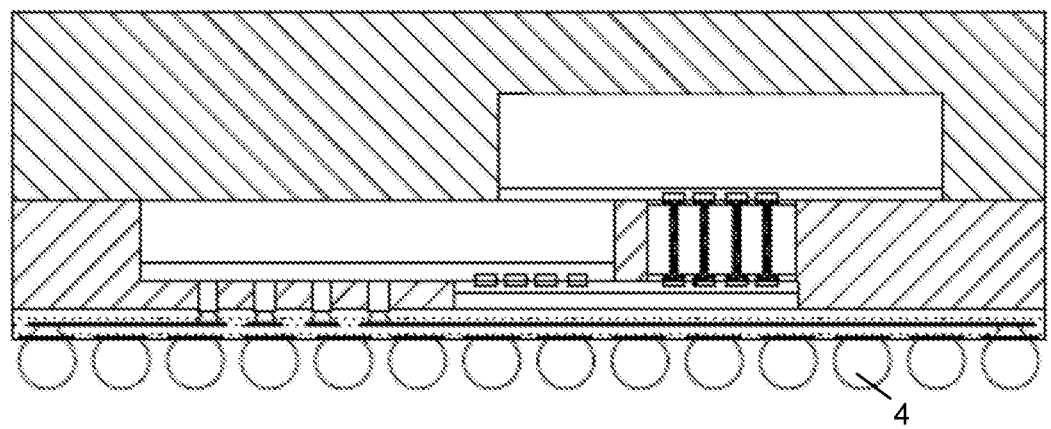

Then a redistribution layer 3 is produced on the reconstructed wafer (FIG. 5F), including conductors 36 from the metal pillars 35 of the logic die 1 to contact pads 5 on the outer surface of the RDL 3. The RDL may be produced in any manner known in FO-WLP technology. At this point, contacts are available to fully test the embedded die 1 and in case of a faulty die, a decision can be made not to assemble additional dies on this particular location of the reconstructed wafer. The assembly is then transferred to a second temporary carrier wafer 40 (FIG. 5G) and attached thereto via a second adhesive layer 41, after which the first carrier 25 and adhesive layer 26 are removed, exposing the backside of the TSV insert 16 and the logic die 1. At this point the high density TSV insert 16 and the connections via the lateral connecting device 18 to the embedded die 1 can be tested. In case these connections are defective, a decision can be made not to assemble additional devices at this location. As seen still in FIG. 5G, the memory die 15 is then mounted on the backside by flip-chip bonding, establishing contact between the array of contacts 8 on the memory die and the array of contacts 11 on the backside of the TSV insert 16. The memory die 15 is then embedded also in mold material 21 (FIG. 5H), after which the second carrier 40 and adhesive layer 41 are removed (FIG. 5I) and the package level bumps 4 are applied (FIG. 5J).

Other process sequences may be devised by the skilled person for the production of the package of FIG. 4. For example, it is possible also to first place the lateral connecting device 18 on a first temporary carrier, followed by flip-chip bonding of the TSV insert 16 and the logic die 1 to the lateral connecting device 18. This is then followed by embedding the assembly of the lateral connecting device 18, the TSV insert 16 and the logic die 1 in mold material by compression molding or transfer molding, and producing the RDL 3 and package level bumps 4. The choice of process sequence may influence the number of temporary carriers needed to complete the fabrication process.

Figure 6:
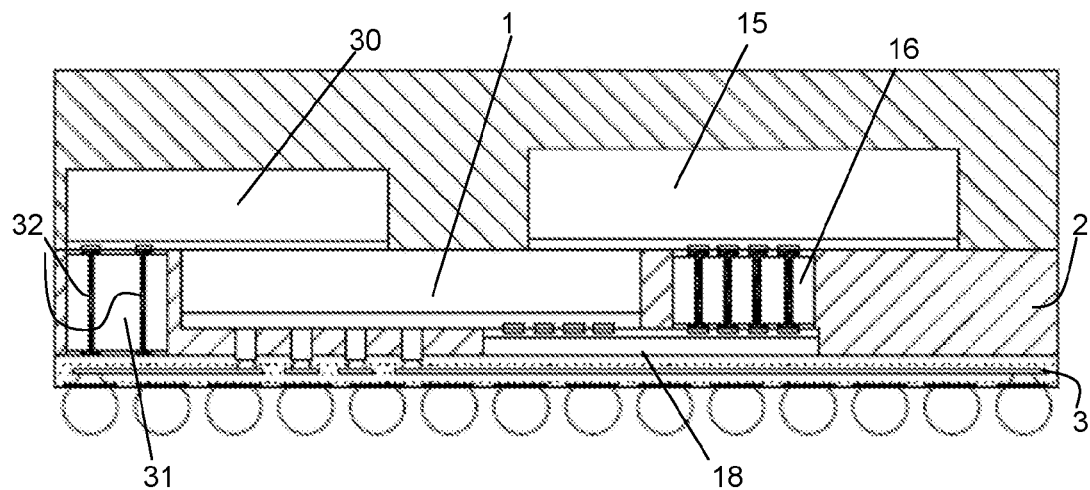
FIG. 6 shows the package of FIG. 4, with an additional die and an additional TSV insert.

As shown in FIG. 6, the embodiment of FIG. 4 may also be combined with an additional insert 31 with fewer TSVs 32 for connecting a flash memory die 30 to the logic die 1.

Figure 7:
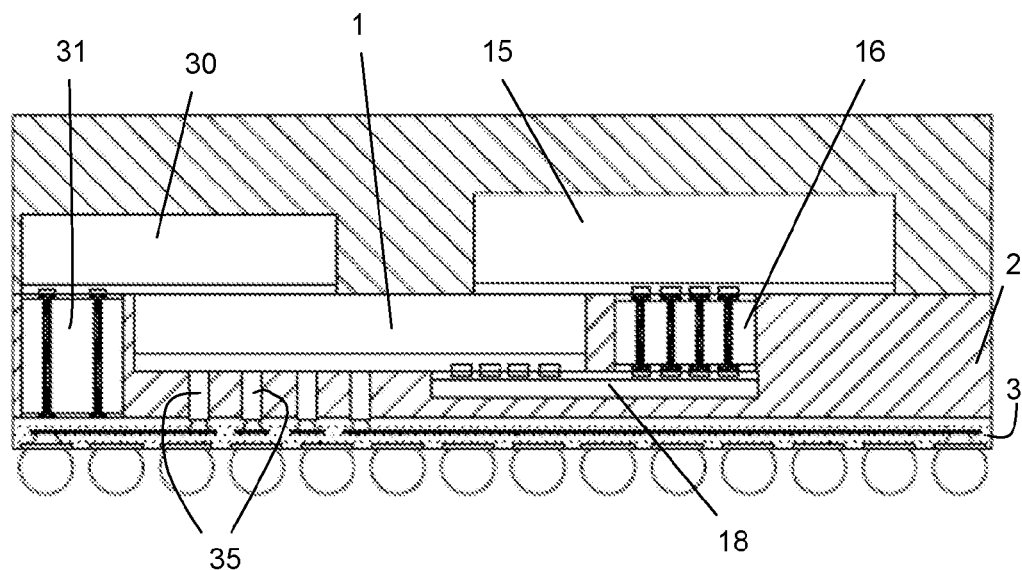
FIG. 7 shows an alternative embodiment of the package according to the present disclosure.

FIG. 7 shows an alternative to the embodiments shown in FIGS. 4 to 6, having the same advantages of these embodiments. In the assembly of FIG. 7, the pillars 35 are significantly higher than the thickness of the lateral connecting device 18 and the RDL 3 is not in physical contact with the backside of the lateral connecting device 18. In the process sequence for producing such a package, the lateral connecting device 18 is mounted on the logic die 1 and the TSV insert 16 prior to the molding step, as in FIG. 5C, but the lateral connecting device 18 has already the final thickness at that point, whereas in FIG. 5C it has a higher thickness that is afterwards thinned down in the step shown in FIG. 5D. In the alternative process, thinning down of the polymer 2' takes place until the (higher) pillars 35 are exposed. At that point, a layer of polymer 2' is still present on the backside of the lateral connecting device 18. The RDL 3 is then produced on the planarized surface, in the same way as shown in FIG. 5F and completion of the package also takes place in the manner shown in FIGS. 5G through 5J.

While the present disclosure has been illustrated and described in detail in the drawings and foregoing description, such illustration and description are to be considered illustrative or exemplary and not restrictive. Other variations to the disclosed embodiments can be understood and effected by those skilled in the art in practicing the present disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

Unless specifically specified, the description of a layer being present, deposited or produced "on" another layer or substrate, includes the options of
  the layer being present, produced or deposited directly on, i.e. in physical contact with, the other layer or substrate, and
  the layer being present, produced or deposited on one or a stack of intermediate layers between the layer and the other layer or substrate.

Unless specifically specified, the description of a device being present, mounted or produced 'on' a surface, includes the options of
  the device being present, mounted or produced directly on, i.e. in physical contact with the surface, and
  the device being present, mounted or produced on one or a stack of intermediate layers between the surface and the device.

What is claimed is:

1. A semiconductor die package comprising:
  a substrate formed of a mold material, wherein embedded side by side in the mold material are a first semiconductor die and a Through Substrate Via (TSV) insert, the substrate, the TSV insert, and the first semiconductor die having a front side and a back side, and wherein the TSV insert comprises N contacts on the front side of the TSV insert, N contacts on the backside of the TSV insert, and N metal-filled vias individually interconnecting the contacts on the front and back sides of the TSV insert, N being an integer higher than or equal to 1,
  the first semiconductor die comprises N contacts on the front side of the first semiconductor die,
  the first semiconductor die further comprises one or more contact terminals on the front side of the first semiconductor die;
  a second semiconductor die mounted on the back side of the substrate, the second semiconductor die comprising N contacts which are individually connected to the N contacts of the TSV insert on the back side of the TSV insert;
  a lateral connecting device mounted on the front side of the first semiconductor die and the TSV insert, the lateral connecting device being provided with a first and second group of N contacts each, the groups being placed side by side on the same surface of the lateral connecting device, wherein the first and second group of N contacts are individually interconnected inside the lateral connecting device, and wherein the first and second groups of N contacts on the lateral connecting device are individually connected respectively to the N contacts on the first semiconductor die and to the N contacts of the TSV insert on the front side of the TSV insert, so that the N contacts on the first semiconductor die are individually connected to the N contacts on the second semiconductor die, through the lateral connecting device and the TSV insert; and
  a plurality of package level contact bumps connected to at least some of the contact terminals on the first semiconductor die.

2. The package according to claim 1, wherein the lateral connecting device is external to the substrate and mounted on the front side of the substrate.

3. The package according to claim 2, further comprising a redistribution layer (RDL) on the front side of the substrate, wherein the package level contact bumps are mounted on the outer surface of the RDL and connected to the contact terminals of the first semiconductor die through conductors within the RDL, and wherein the lateral connecting device is equally mounted on the outer surface of the RDL.

4. The package according to claim 3, wherein the RDL comprises conductors connecting the N contacts on the first semiconductor die to a first group of N corresponding contacts on the outer surface of the RDL, the RDL further comprising conductors connecting the N contacts on the front side of the TSV insert to a second group of N corresponding contacts on the outer surface of the RDL, and wherein the first and second group of N contacts on the lateral connecting device are bonded individually respectively to the first and second groups of contacts on the RDL.

5. The package according to claim 3, further comprising one or more additional semiconductor dies mounted on the back side of the substrate, each additional die being connected to the front side of the substrate by an additional TSV insert and wherein the additional TSV insert is connected to the first semiconductor die by conductors within the RDL.

6. The package according to claim 1, wherein the lateral connecting device is bonded directly to the front side of the first semiconductor die and the TSV insert.

7. The package according to claim 6, wherein the lateral connecting device is equally embedded in the mold material of the substrate.

8. The package according to claim 6, wherein the contact terminals of the first semiconductor die are contact pillars, the height of which is sufficient for contacting the first semiconductor die from the front side despite the presence of the lateral connecting device.

9. The package according to claim 8, further comprising a redistribution layer (RDL) on the front side of the substrate, wherein the package level contact bumps are mounted on the outer surface of the RDL and connected to the contact pillars of the first semiconductor die through conductors within the RDL.

10. The package according to claim 9, wherein the RDL is in direct physical contact with the back side of the lateral connecting device.

11. The package according to claim 9, wherein a layer of mold material is present between the RDL and the back side of the lateral connecting device.

12. The package according to claim 1, wherein the lateral connecting device comprises a semiconductor substrate and a back end of line portion, and wherein the interconnection between the first and second group of contacts of the lateral connecting device is established through circuitry in the back end of line portion.

13. The package according to claim 1, wherein the first semiconductor die is a logic die, wherein the second semiconductor die is a memory die, and wherein the N contacts on the first and second semiconductor dies are formed as dense arrays of I/O contacts.

14. The package according to claim 1, wherein the N contacts on the second semiconductor die are bonded directly to the N contacts on the back side of the TSV insert.

* * * * *